United States Patent
Goto (10) Patent No.: US 9,252,321 B2
(45) Date of Patent: Feb. 2, 2016

(54) OPTO-MECHANICAL ALIGNMENT

(71) Applicant: Empire Technology Development LLC, Wilmington, DE (US)

(72) Inventor: Hiroshi Goto, Ibaraki (JP)

(73) Assignee: Empire Technology Development LLC, Wilmington, DE (US)

( * ) Notice: Subject to any disclaimer, the term of this patent is extended or adjusted under 35 U.S.C. 154(b) by 0 days.

(21) Appl. No.: 14/349,656

(22) PCT Filed: Apr. 22, 2013

(86) PCT No.: PCT/US2013/037560
§ 371 (c)(1),
(2) Date: Apr. 3, 2014

(87) PCT Pub. No.: WO2014/175856
PCT Pub. Date: Oct. 30, 2014

(65) Prior Publication Data
US 2015/0087092 A1    Mar. 26, 2015

(51) Int. Cl.
*H01L 21/68* (2006.01)
*H01L 21/02* (2006.01)
*H01L 31/0232* (2014.01)
*H01L 31/0203* (2014.01)
(Continued)

(52) U.S. Cl.
CPC .......... *H01L 33/005* (2013.01); *G02B 6/4204* (2013.01); *H01L 31/0203* (2013.01); *H01L 31/0232* (2013.01); *H01L 31/02325* (2013.01); *H01L 31/18* (2013.01); *H01L 33/58* (2013.01); *H01S 5/005* (2013.01); *G02B 6/32* (2013.01); *G02B 6/4212* (2013.01); *G02B 6/4214* (2013.01); *H01L 2224/83143* (2013.01); *H01L 2933/0033* (2013.01); *H01L 2933/0058* (2013.01)

(58) Field of Classification Search
None
See application file for complete search history.

(56) References Cited

U.S. PATENT DOCUMENTS 5,770,465 A * 6/1998 MacDonald et al. ............ 216/2
6,320,706 B1   11/2001 Richard et al.
(Continued)

FOREIGN PATENT DOCUMENTS

JP         2005064303 A      3/2005

OTHER PUBLICATIONS

Fukushima et al. "Self-Assembly of Chip-Size Components with Cavity Structures:High-Precision Alignment and Direct Bonding without Thermal Compression for Hetero Integration" Micromachines 2011, 2, 49-68; doi:10.3390/mi2010049.*
(Continued)

*Primary Examiner* — Calvin Choi
*Assistant Examiner* — Xiaoming Liu
(74) *Attorney, Agent, or Firm* — Turk IP Law, LLC (57) ABSTRACT

Technologies are generally described for manufacturing an optical device by attaching a light-emitting element to an optical element through a resin. In various examples, a method is described, where a substrate is provided to have a through-hole at a position in the substrate where an optical element is to be mounted. A resin in liquid state may be injected into the through-hole in the substrate. Further, an optical element having a light-emitting portion may be mounted on the substrate such that a center of the tight-emitting portion is self-aligned with a center of the through-hole due to a surface tension of the resin in liquid state. The resin may be cured such that the optical element is fixed to the substrate.

12 Claims, 8 Drawing Sheets

(51) Int. Cl.
*H01L 33/00* (2010.01)
*H01L 31/18* (2006.01)
*H01L 33/58* (2010.01)
*H01S 5/00* (2006.01)
*G02B 6/42* (2006.01)
*G02B 6/32* (2006.01)

(56) References Cited

U.S. PATENT DOCUMENTS

| | | | |
|---|---|---|---|
| 6,886,994 B2 | 5/2005 | Shekel et al. | |
| 7,242,033 B2 | 7/2007 | Isokawa et al. | |
| 7,327,774 B2 | 2/2008 | Chabinye et al. | |
| 8,076,782 B2 | 12/2011 | Asai et al. | |
| 8,183,313 B2 | 5/2012 | Kitamura et al. | |
| 2002/0132927 A1* | 9/2002 | Gaddam et al. | 525/242 |
| 2008/0089637 A1 | 4/2008 | Farah et al. | |
| 2009/0169035 A1 | 7/2009 | Rombach et al. | |
| 2009/0290337 A1* | 11/2009 | Tomoda et al. | 362/231 |
| 2010/0003786 A1* | 1/2010 | Feger et al. | 438/113 |
| 2012/0242216 A1 | 9/2012 | Kotani et al. | |

OTHER PUBLICATIONS

Lo, J.C.C., et al., "Modified Passive Alignment of Optical Fibers with Low Viscosity Epoxy Flow Running in V-grooves," Electronic Components and Technology Conference, vol. 1, pp. 830-834.

Tan. Q., and Lee, Y.C., "Soldering Technology for Optoelectronic Packaging," Chapter 5, Proceedings—Electronic Components and Technology Conference, pp. 35 (1996).

International Search Report with Written Opinion for International Application No. PCT/US2013/037560 mailed on Aug. 13, 2013.

* cited by examiner

OPTO-MECHANICAL ALIGNMENT

CROSS-REFERENCE TO RELATED APPLICATION

This Application is the National Stage filing under 35 U.S.C §371 of PCT Application Ser. No. PCT/US13/37560 filed on Apr. 22, 2013. The PCT Application is herein incorporated by reference in its entirety.

BACKGROUND

Unless otherwise indicated herein, the approaches described in this section are not prior art to the claims in this application and are not admitted to be prior art by inclusion in this section.

In implementing an optical communication system, alignment of an optical element such as a light-emitting element with another optical element such as an optical waveguide may be required. In such system, the light-emitting element such as a semiconductor laser or an LED (light-emitting diode) may serve as a source for generating optical communication signals while the optical waveguide serves as a channel for optical signal propagation. Accordingly, precise alignment of the light-emitting element with the optical waveguide may be important for providing a high speed and quality communication performance with minimal light propagation loss.

Some methods for alignment of a light-emitting element with an optical waveguide have been developed for practical use. In this example method, individual optical elements can be mounted by a machine manipulator at predetermined positions on a substrate which has been machined with high-precision machining process or MEMS (micro-electro-mechanical systems) process. Due to the limitation of machining precision and mechanical manipulation precision (which is typically on the order of about a few micrometers), precision of alignment may also be limited to a micron order. Thus, this example method may not be applicable to high-precision alignment at a submicron level.

In another example method, alignment of a light-emitting element with an optical waveguide can be controlled based on a result of performing optical detection, e.g., checking whether the optical performance satisfies desired characteristics, Since the precision of alignment in this method depends on optical detection accuracy, alignment for a submicron level precision may be achieved by fine-tuning a control system for optical detection. However, each alignment operation may require an optical detection operation, resulting in increase of the entire manufacturing costs.

As described above, with the conventional optical element alignment methods, it may be difficult to perform alignment operations in such a way that both high quality and low cost requirements are met. However, in some cases, there may be demands for aligning and mounting optical elements with high precision and at low cost.

SUMMARY

Technologies are generally described for opto-mechanical alignment by which an optical element such as a light-emitting element can be aligned with another optical element with high precision and at low cost.

Various example optical devices described herein may include a substrate and an optical element. The substrate may have a through-hole. The optical element may have a light-emitting portion and may be attached to the substrate through a resin, such that a center of the light-emitting portion of the optical element is self-aligned with a center of the through-hole of the substrate.

In some examples, methods for manufacturing an optical device are described. The example methods may include providing a substrate having a through-hole at a position in the substrate where an optical element is to be mounted. A resin in liquid state may be injected into the through-hole in the substrate. Further, an optical element having a light-emitting portion may be mounted on the substrate such that a center of the light-emitting portion is self-aligned with a center of the through-hole due to a surface tension of the resin in liquid state. The resin may be cured such that the optical element is fixed to the substrate.

In some examples, a computer-readable storage medium is described that may be adapted to store a program for causing a processor to manufacture an optical device. The processor may include various features as further described herein. The program may include one or more instructions for providing a substrate having a through-hole at a position in the substrate where an optical element is to be mounted, and injecting a resin in liquid state into the through-hole in the substrate. Further, the program may include one or more instructions for mounting an optical element having a light-emitting portion on the substrate such that a center of the light-emitting portion is self-aligned with a center of the through-hole due to a surface tension of the resin in liquid state, and curing the resin such that the optical element is fixed to the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and other features of this disclosure will become more fully apparent from the following description and appended claims, taken in conjunction with the accompanying drawings, Understanding that these drawings depict only several embodiments in accordance with the disclosure and are, therefore, not to be considered limiting of its scope, the disclosure will be described with additional specificity and detail through use of the accompanying drawings, in which:

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein, This disclosure is generally drawn, inter alia, to methods, devices, apparatus, systems, and computer program products related to opto-mechanical alignment by which an optical element such as a light-emitting element can be aligned with another optical element.

Briefly stated, technologies are generally described tier manufacturing an optical device by attaching an optical element to a substrate through a resin. In various examples, a method is described, where a substrate is provided to have a through-hole at a position in the substrate where an optical element is to be mounted. A resin in liquid state may be injected into the through-hole in the substrate. Further, an optical element having a light-emitting portion may be mounted on the substrate such that a center of the light-emitting portion is self-aligned with a center of the through-hole due to a surface tension of the resin in liquid state. The resin may be cured such that the optical element is fixed to the substrate.

In some embodiments, the resin may be an ultraviolet curing resin, which may be cured by irradiating an ultraviolet light onto the resin. For example, the resin may be cured by irradiating the resin with an ultraviolet light with energy in a range of about 10 to 1,000 mJ or with an ultraviolet light with luminance in a range of about 100 to 1,000 mW/cm$^2$ with an exposure time in a range of about 1 to 5 seconds.

In some embodiments, the resin may be a thermosetting resin, which may be cured by heating the resin. For example, the thermosetting resin may be cured by heating the resin at temperature of about 100 Celsius degrees for about 10 minutes to several hours.

In some embodiments, the substrate may be provided with an electrode on an upper side of the substrate, and the optical element may be provided with an electrode on a lower side of the optical element, Further, a solder reflow process may be performed to attach the electrode of the substrate to the electrode of the optical element.

In some embodiments, the through-hole in the substrate may be formed using a high-aspect-ratio MEMS (micro-electro-mechanical system) dry etching process, Also, the through-hole in the substrate may have a circular shape or a polygonal shape.

In some embodiments, a wettability of a side surface of the through-hole in the substrate may be adjusted. The wettability of the side surface of the through-hole in the substrate may be adjusted by performing a surface finishing process on the side surface of the through-hole. In case of using silicon as the substrate, a dry etching process may be used in performing the surface finishing process on the side surface of the through-hole. Alternatively, the wettability of the side surface of the through-hole in the substrate may be adjusted by coating a water-repellent material, such as fluoropolymer, on the side surface of the through-hole.

Figure 1A:
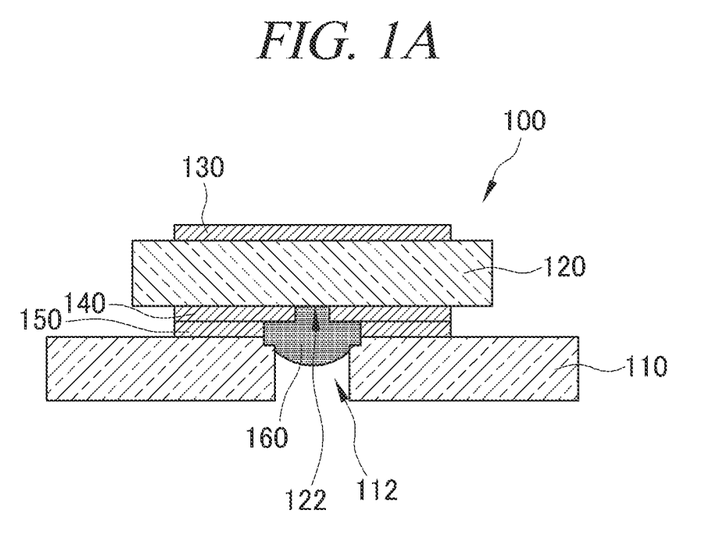
FIGS. 1A and 1B schematically show a cross-sectional view and a plan view of an illustrative example optical device including an optical element a center of which is aligned with a center of a through-hole in a substrate.
Figure 1B:
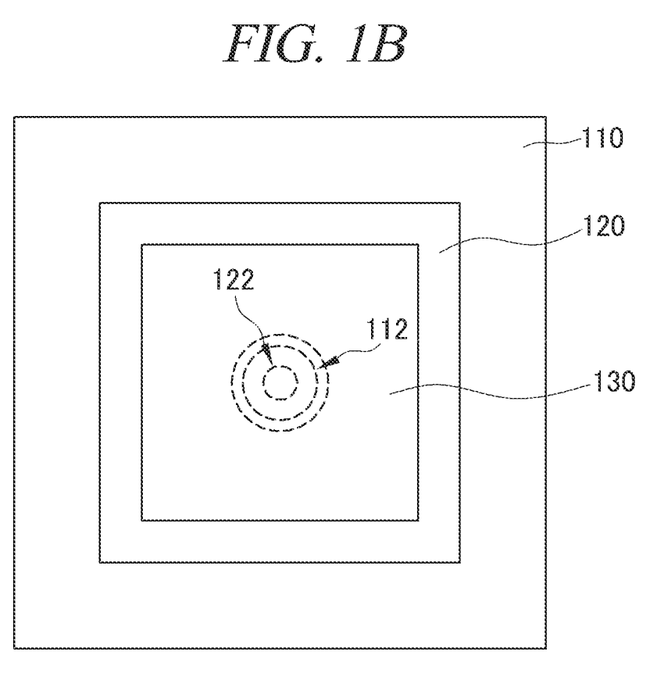

FIGS. 1A and 1B schematically show a cross-sectional view and a plan view of an illustrative example optical device including an optical element a center of which is aligned with a center of a through-hole in a substrate, arranged in accordance with at least some embodiments described herein, As depicted, an optical device 100 may include a substrate 110 and an optical element 120 formed on or above substrate 110, For example, optical element 120 may include a light-emitting element such as a surface-emitting semiconductor laser and an LED (light-emitting diode), a light-receiving element such as a photo-diode and a CCD (charge-coupled device), or any suitable type of optical element such as a lens and a diffraction grating. Further, optical element 120 may be attached or formed at a position above substrate 110 through a resin 160. Optical device 100 as shown in FIG. 1 may be used as a part of an optical communication system to serve as a unit for generating an optical communication signal. The optical communication signal generated from optical device 100 may be transmitted through an optical channel, such as an optical fiber or an optical waveguide, which may be coupled to optical device 100 in the optical communication system.

In some embodiments, substrate 110 may be formed using monocrystalline silicon, a glass, or any combinations thereof. Also, substrate 110 may have a through-hole 112, which may have a circular shape, polygonal shape, or any other shape (e.g., square, oval, elliptical, etc.) when seen from the plane view. As depicted in FIG. 1, through-hole 112 may have an upper portion 114 with a larger width (or radius) than a lower portion 116 (see FIG. 4A). More specifically, the upper portion of through-hole 112 may be coupled to the lower portion of through-hole 112 in a stepwise shape. Additionally, an electrode 150, which may be made of a metallic material, may be formed a portion of an upper surface of substrate 110.

In some embodiments, optical element 120 may have a light-emitting portion 122 from which light such as laser light may be irradiated in a direction towards through-hole 112 through resin 160. The light from light-emitting portion 122 of optical element 120 may be used to carry an optical communication signal in the optical communication system. In one embodiment, optical element 120 may be additionally provided with an electrode 140 (e.g., a metallic electrode, or some other conductive or semi-conductive electrode) on a lower side of optical element 120 and/or an electrode 130 on an upper side of optical element 120. Forward electrical bias may be provided through electrodes 130 and 140 of optical element 120, which may causes light to be generated from light-emitting portion 122. In some examples, optical element 120 may be a surface-emitting laser diode, an edge-emitting laser, an LED (light-emitting diode), or an optical sensor such as a photo-diode, a CCD sensor and a line sensor.

As illustrated in FIG. 1, optical element 120 may be attached or formed at a position above substrate 110 through resin 160. A center of light-emitting portion 122 of optical element 120 may be self-aligned with a center of through-hole 112 of substrate 110 during an alignment process in a method for manufacturing optical device 100, which will be described later in more detail. In a particular example, optical element 120 may be attached to substrate 110 by performing a method, where a resin in liquid state is injected into through-hole 112 in substrate 110. As a result of the resin injection process, optical element 120 may be formed on substrate 110 such that a center of light-emitting portion 122 is self-aligned with a center of through-hole 112 due to a surface tension of the resin in liquid state. The resin may be subsequently cured such that optical element 120 is fixed to substrate 110 about the through-hole 112.

In some embodiments, resin 160 may correspond to an ultraviolet curing resin, a thermosetting resin, or combinations thereof. In case of using an ultraviolet curing resin, resin 160 may be cured by irradiating an ultraviolet light onto resin 160. For example, resin 160 may be cured by irradiating an ultraviolet light with energy in a range of about 10 to 1,000 mJ or with an ultraviolet light with luminance in a range of about 100 to 1,000 mW/cm$^2$ with an exposure time in a range of about 1 to 5 seconds. Specifically, if resin 160 has a thickness of about 10 to 100 micrometers, resin 160 may be cured by irradiating an ultraviolet light with energy in a range of about 1,000 mJ, which may be equivalent to an ultraviolet light with luminance of about 1,000 mW/cm$^2$ with an exposure time of about 1 second or with luminance of about 200 mW/cm$^2$ with an exposure time of about 5 seconds. Alternatively, in case of using a thermosetting resin, resin 160 may be cured by heating resin 160, e.g., at temperature of about 100 Celsius degrees for about 10 minutes to several hours.

As shown in FIG. 1, a portion of resin 160 may be at least partially filled in the upper portion of through-hole 112 while some other portion of resin 160 may be at least partially filled in the lower portion of through-hole 112. Further, a bottom surface of resin 160 may have a curved surface with a curvature determined according to the contact angle of the side surface of through-hole 112. The contact angle of the side surface of through-hole 112 may be determined according to water-repellency or roughness of the side surface of through-hole 112. In some embodiments, the side surface of through-hole 112 in substrate 110 may have a water-repellent structure, such as wedge-like shapes, or may be coated with a water-repellent material. In this manner, the curvature of the bottom surface of resin 160 may be controlled, and thus, characteristics of light beam emitted from optical element 120 may be controlled. That is, by utilizing the lens effect of resin 160, the coupling efficiency of the light incident from optical element 120 into an optical channel such as an optical fiber or an optical waveguide (not shown) can be improved.

In some embodiments, electrode 140 of optical element 120 may be attached to electrode 150 of substrate 110 to ensure electrical connection between optical element 120 and substrate 110. More specifically, after attaching substrate 110 to optical element 120 by curing resin 160, a heat treatment such as a solder reflow process may be performed. For example, the metallic material of electrodes 140 and 150 may be heated at a temperature of about 200 to 250 degrees, thereby being fused and joined with each other. To avoid deformation of resin 160 during the heat treatment, a resin having superior heat endurance may be used as resin 160.

Figure 2:
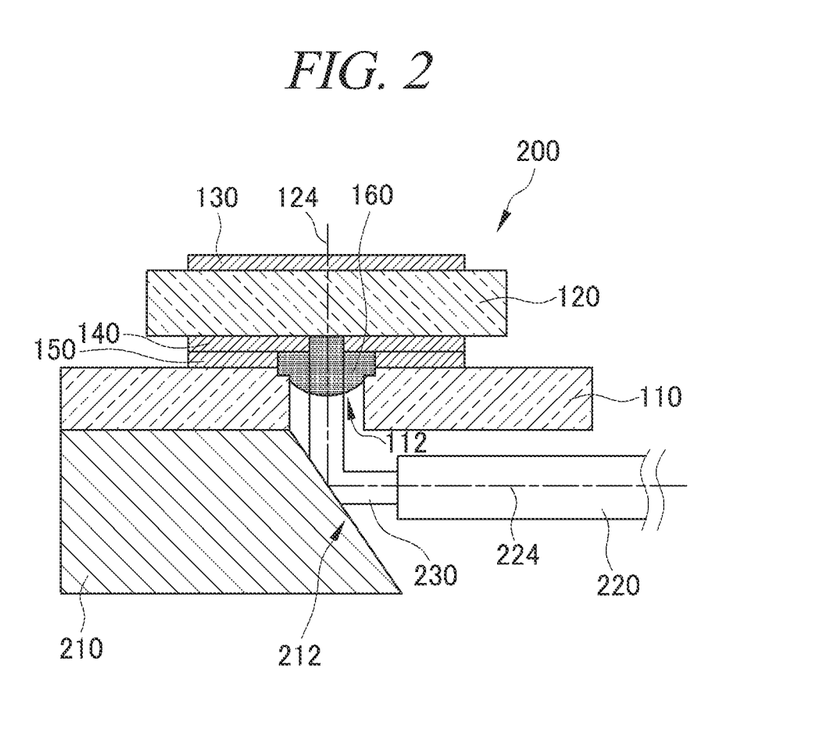
FIG. 2 schematically shows a cross-sectional view of an illustrative example optical device including an optical element aligned with an optical waveguide through a through-hole in a substrate.

FIG. 2 schematically shows a cross-sectional view of an illustrative example optical device including an optical element aligned with an optical waveguide through a through-hole in a substrate, arranged in accordance with at least some embodiments described herein. As depicted, an optical device 200 may include a substrate 110 and an optical element 120 formed on or above substrate 110. Further, optical element 120 may be attached, coupled or formed at a certain position with respect to substrate 110 through a resin 160. The above elements of optical device 200 may have a similar configuration to those of optical device 100 as shown in FIG. 1. Optical device 200 as shown in FIG. 2 may be used as a part of an optical communication system to serve as a unit for generating an optical communication signal and transmitting the optical communication signal to another device.

In some embodiments, optical device 200 may further include a substrate 210 attached to a part of the lower surface of substrate 110. Substrate 210 may be formed using monocrystalline silicon, a glass, or any combinations thereof. Also, substrate 210 may have a mirror surface 212 on one side of substrate 210. Mirror surface 212 may be coated with a reflective material such as aluminum (Al) and gold (Au) and may have a predetermined angle, e.g., about 44 to 46 degrees (more specifically about 45 degrees), with respect to a bottom surface of substrate 210. Mirror surface 212 of substrate 210 may be configured to receive a light 230 generated from optical element 120 and reflect light 230 towards an optical fiber or optical waveguide 220.

In some embodiments, an optical axis 224 of optical waveguide 220 may be substantially aligned with an optical axis 124 of optical element 1120. Also, as described above, because the lower surface of resin 160 has a curvature that is substantially determined by the roughness of the side surface of through-hole 112 in substrate 110, such curvature of resin 160 may have a lens effect, which can improve the coupling efficiency of the light incident from optical element 120 into optical waveguide 220.

Figure 3:
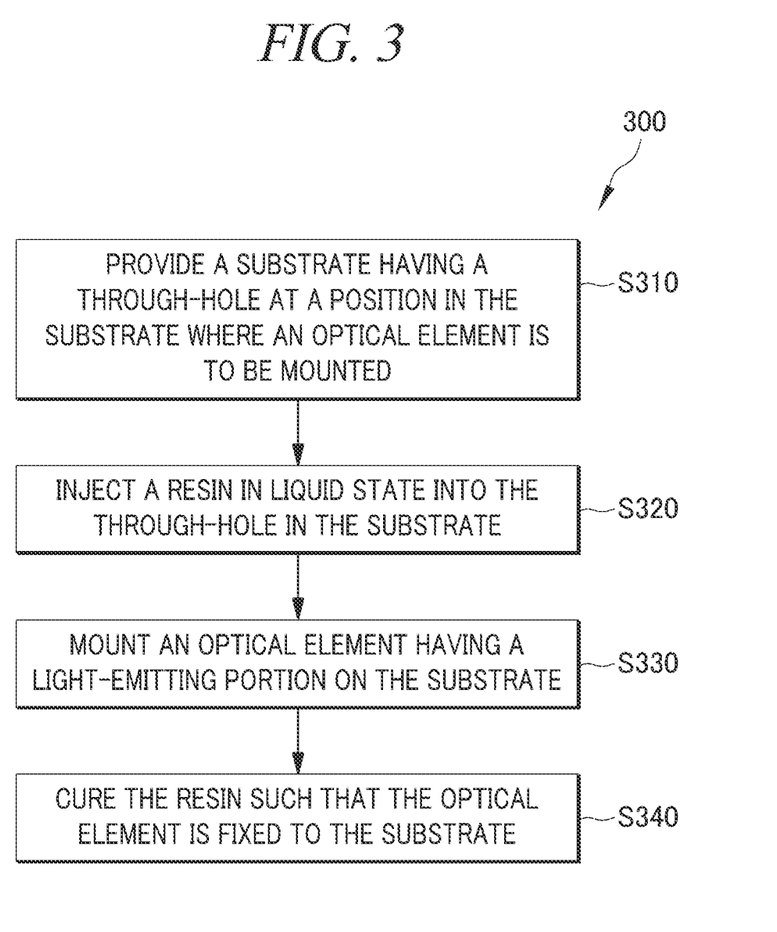
FIG. 3 illustrates an example flow diagram of a method adapted to manufacture an optical device.

FIG. 3 illustrates an example flow diagram of a method adapted to manufacture an optical device in accordance with at least some embodiments described herein. An example method 300 in FIG. 3 may be implemented using, for example, a computing device including a processor adapted to manufacture an optical device e.g., computer 600 in FIG. 6).

Further, FIGS. 4A to 4E schematically shows cross-sectional views of an illustrative example optical device which is manufactured according to some described methods to manufacture an optical device, arranged in accordance with at least some embodiments described herein. In the following, method 300 will be described in detail with reference to FIGS. 4A to 4E.

Method 300 may include one or more operations, actions, or functions as illustrated by one or more of blocks S310, S320, S330 and/or S340. Although illustrated as discrete blocks, various blocks may be divided into additional blocks, combined into fewer blocks, or eliminated, depending on the desired implementation. In some further examples, the various described blocks may be implemented as a parallel process instead of a sequential process, or as a combination thereof. Method 300 may begin at block S310, "PROVIDE A SUBSTRATE HAVING A THROUGH-HOLE AT A POSITION IN THE SUBSTRATE WHERE AN OPTICAL ELEMENT IS TO BE MOUNTED."

At block S310, a substrate may be provided to have a through-hole at a position in the substrate where an optical element is to be mounted. As depicted in FIG. 1A, a substrate 110 may be provided to have a through-hole 112, which may have a circular shape, polygonal shape, or any other shape (e.g., square, oval, elliptical, etc.) when seen from the plane view. Substrate 110 may be formed using monocrystalline silicon, a glass, or any combinations thereof. Through-hole 112 in substrate 110 may be formed using a high-aspect-ratio MEMS thy etching process. Additionally, an electrode 150, which may be made of a metallic material, may be formed a portion of an upper surface of substrate 110.

Figure 4A:
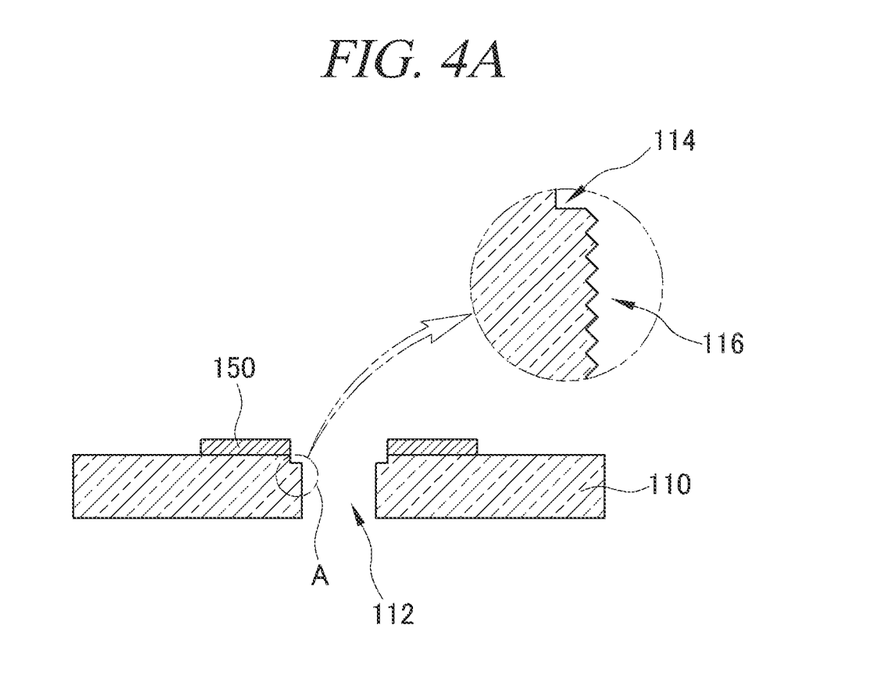
FIGS. 4A to 4E schematically shows cross-sectional views of an illustrative example optical device which is manufactured according to a method adapted to manufacture an optical device.

In some embodiments, as illustrated in an enlarged portion A in FIG. 4A, through-hole 112 of substrate 110 may have an upper portion 114 with a lager width (or radius) than a lower portion 116. More specifically, upper portion 114 of through-hole 112 may be coupled to lower portion 116 of through-hole 112 in a stepwise shape. Further, at least a part of the side surface, e.g., lower portion 116, of through-hole 112 in substrate 110 may have a wettability that can be adjusted according to curvature characteristics of a resin which will be injected into through-hole 112 later. For example, lower portion 116 of through-hole 112 may have a water-repellent structure, such as wedge-like shapes, which may be formed using a surface finishing process. In case of using silicon as substrate 110, a dry etching process may be used in performing the surface finishing process on lower portion 116 of through-hole 112. Although the wedge-shaped structure is illustrated in FIG. 4A, any other types of structures such as a fin-shaped structure may be formed on lower portion 116 of through-hole 112 to provide water-repellent property. Alternatively and/or additionally, lower portion 116 of through-hole 112 may be coated with a water-repellent material such as fluoropolymer. In this manner, the curvature of the bottom surface of the resin, which will be described later, may be controlled.

Figure 4B:
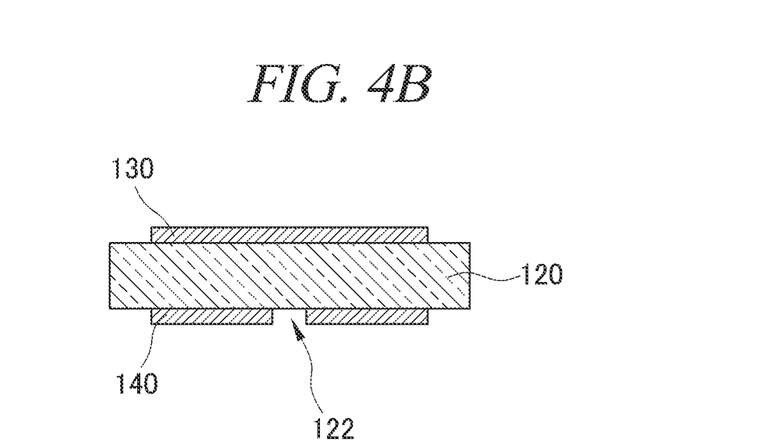

In some embodiments, as illustrated in FIG. 4B, an optical element 120 may be provided to have a light-emitting portion 122 from which light such as laser light may be irradiated in an orthogonal direction with respect to a lower surface of optical element 120. The light from light-emitting portion 122 of optical element 120 may be used to carry an optical communication signal in an optical communication system. Optical element 120 may be additionally provided with an electrode 140 on a lower side of optical element 120 and/or an electrode 130 on an upper side of optical element 120. Forward electrical bias may be applied through electrodes 130 and 140 of optical element 120, which may be utilized to initiate light generation from tight-emitting portion 122. For example, optical element 120 may be a surface-emitting laser diode, an edge-emitting laser, an LED, or an optical sensor. Block S310 may be followed by block S320, INJECT A RESIN IN LIQUID STATE INTO THE THROUGH-HOLE IN TUE SUBSTRATE."

Figure 4C:
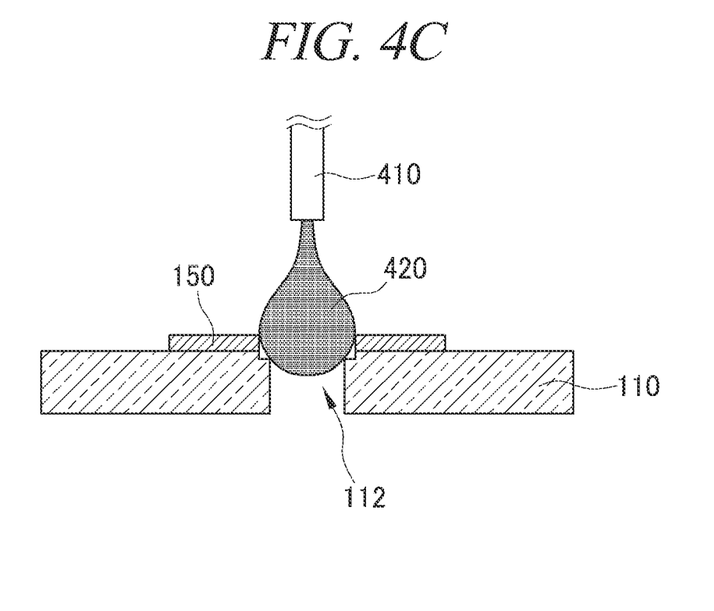

At block S320, a resin in liquid state may be injected into the through-hole in the substrate. As illustrated in FIG. 4C, a predetermined amount of a resin 420 in liquid state may be injected from a nozzle 410 into through-hole 112 of substrate 110. Resin 420 may correspond to an ultraviolet curing resin, a thermosetting resin, or combinations thereof. For example, an ultraviolet curing resin used in nano-imprint lithography may be used as resin 420.

In some embodiments, since the wettability of the side surface of through-hole 112 has been adjusted as described above, resin 420 in liquid state may be filled in the upper portion of through-hole 112 while some other portion of resin 420 may be partially filled in the lower portion of through-hole 112. Further, electrode 150 may have a different wettability from the upper surface of substrate 110, which substantially prevents resin 420 from spreading over electrode 150. Block S320 may be followed by block S330, MOUNT AN OPTICAL ELEMENT HAVING A LIGHT-EMITTING PORTION ON THE SUBSTRATE.

Figure 4D:
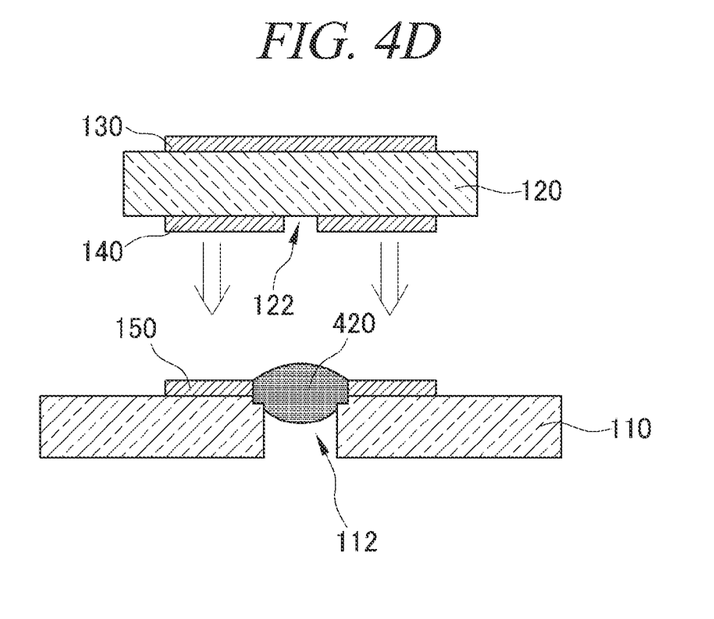

At block S330, an optical element having a light-emitting portion may be mounted on the substrate. As illustrated in FIG. 4D, optical element 120 may be transferred to the vicinity of through-hole 112 of substrate 110, e.g., by a machine manipulator (not shown), and may be placed on substrate 110. At this time, due to the effect of the surface tension of resin 420 in liquid state, a center of light-emitting portion 122 may be self-aligned with a center of through-hole 112. Additionally, since electrode 130 of optical element 120 has different wettability from light-emitting portion 122, light-emitting portion 122 may receive a force such that light-emitting portion 122 is attracted towards a top surface of resin 420.

As such, light-emitting portion 122 of optical element 120 may be substantially self-aligned with through-hole 112 of substrate 110, while electrode 130 of optical element 120 may be brought into tight contact with electrode 150 of substrate 110. Block S330 may be followed by block S340, CURE THE RESIN SUCH THAT THE OPTICAL ELEMENT IS FIXED TO THE SUBSTRATE."

Figure 4E:
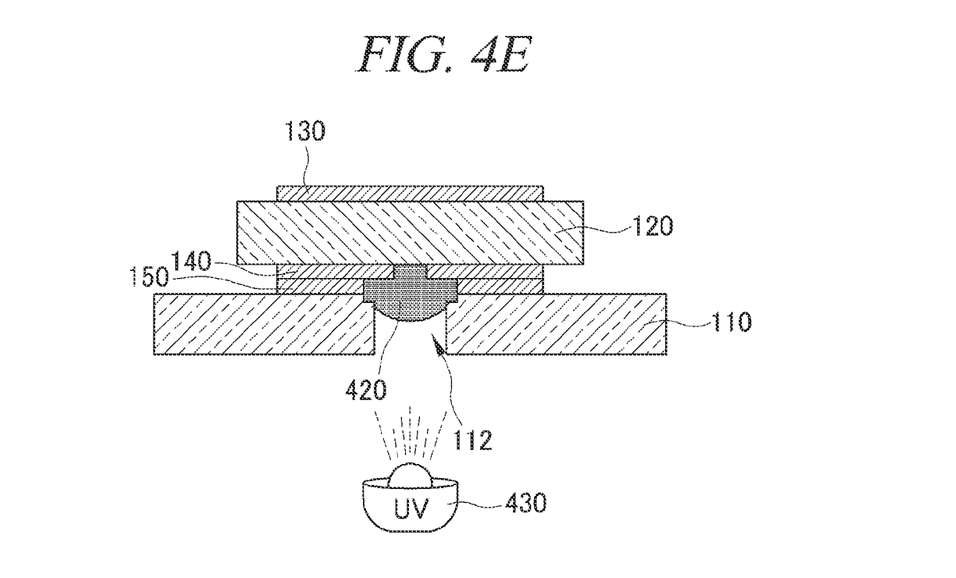

At block S340, the resin may be cured such that the optical element is fixed to the substrate. As depicted in FIG. 4E, if resin 420 corresponds to an ultraviolet curing resin, resin 420 may be cured by irradiating an ultraviolet (UV) light from an UV light source 430 onto resin 420. Alternatively, in case of using a thermosetting resin, resin 420 may be cured by heating resin 420 under certain conditions. For example, thermosetting resin 420 may be cured by heating resin 420 at temperature of about 100 Celsius degrees for about 10 minutes to several hours.

In the process of curing resin 420, a bottom surface of resin 420 may have a curved surface with a curvature determined according to the contact angle of the side surface of through-hole 112. As described above, the contact angle of the side surface of through-hole 112 may be determined according to water-repellency or roughness of the side surface of through-hole 112. In this manner, the curvature of the bottom surface of resin 420 may be controlled, and thus, characteristics of light beam emitted from optical element 120 may be controlled. Also, by utilizing the tens effect of resin 420, the coupling efficiency of the light incident from optical element 120 into an optical channel such as an optical fiber or an optical waveguide (not shown) can be improved.

In some embodiments, after attaching substrate 110 to optical element 120 by curing resin 420 at block S340, a heat treatment such as a solder reflow process may be performed to ensure electrical connection between electrode 140 of optical element 120 and electrode 150 of substrate 110. For example, the metallic material of electrodes 140 and 150 may be heated at a temperature of about 200 to 250 degrees for several seconds, thereby being fused and joined with each other. To avoid deformation of resin 420 during the heat treatment, a resin having superior heat endurance may be used as resin 420. Alternatively, an ultrasound welding method may be used for fusing and joining the metallic material of electrodes 140 and 150. This method may be useful in heating the metallic material of electrodes 140 and 150 without causing thermal stress on the other part of the optical device.

One skilled in the art will appreciate that, for this and other methods disclosed herein, the functions performed in the methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

By performing the above method of manufacturing the optical device, self-alignment of optical element 120 with substrate 110 can be achieved with high-precision and at low cost. Specifically, the above method uses operations on a simple structure including a substrate that has been machined into a desired shape in advance (e.g., using a MEMS process) and an ultraviolet curing resin for fixing an optical element to the substrate. Thus, various units that may be required by the conventional technology, such as an optical detection system, a high-precision manipulator, and so on, may not be required, so that the entire manufacturing costs can be reduced.

Further, since an optical element can be mounted at a predetermined position on a substrate at a submicron level (e.g., with precision of about 0.2 to 0.3 micron order) by exploiting the surface tension characteristic of a resin in liquid state, the above method can achieve improved reproducibility of manufacturing an optical device at high precision. Furthermore, the cured resin can function as a part of the optical element (e.g., lens). Thus, coupling efficiency of a light beam emitted from the optical element toward an optical waveguide can be improved.

Additionally, as a result of performing the method with improved reproducibility, the yield for manufacturing a plurality of optical devices can be increased. For example, by defining a plurality of mounting positions on a substrate in advance, it is possible to simultaneously fix a plurality of optical elements to a corresponding number of substrates in an integrated form with high precision.

Figure 5:
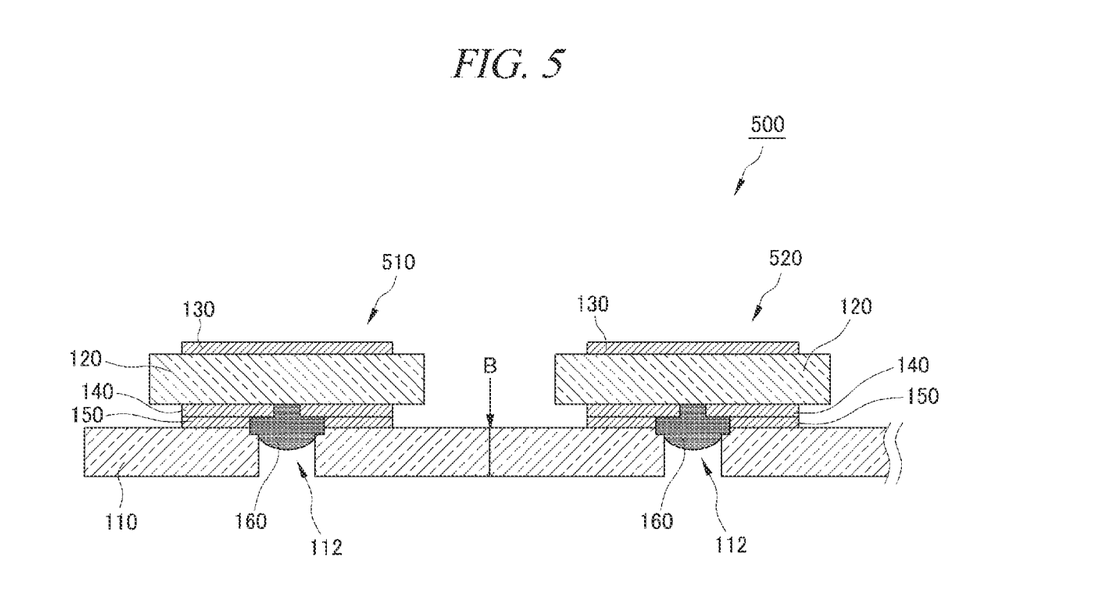
FIG. 5 schematically shows a cross-sectional view of an illustrative example optical device where a plurality of optical elements is mounted at predetermined positions on a substrate.

FIG. 5 schematically shows a cross-sectional view of an illustrative example optical device where a plurality of optical elements is mounted at predetermined positions on a substrate, arranged in accordance with at least some embodiments described herein Ns depicted, an optical device 500 may include a plurality of optical devices 510 and 520. Each of optical devices 510 and 520 may include a substrate 110 and an optical element 120 formed on or above substrate 110, Further, in each of optical devices 510 and 520, optical element 120 may be attached or funned at a certain position with respect to substrate 110 through a resin 160. The above elements of each optical device 510 or 520 may have a similar configuration to optical device 100 as shown in FIG. 1.

In some embodiments, each of optical devices 510 and 520 may be manufactured by performing the method as described above with reference to FIGS. 4A and 4E. Further, in performing the method, a similar process may be performed on optical devices 510 and 520 in a parallel manner, e.g., using a corresponding number of surface-machining devices, resin-injecting nozzles, machine manipulators, and so on. Once optical device 500 integrating a plurality of optical devices 510 and 520 has been manufactured, optical device 500 may be diced into individual optical devices 510 and 520 by cutting substrate 110 at a predetermined position B.

Figure 6:
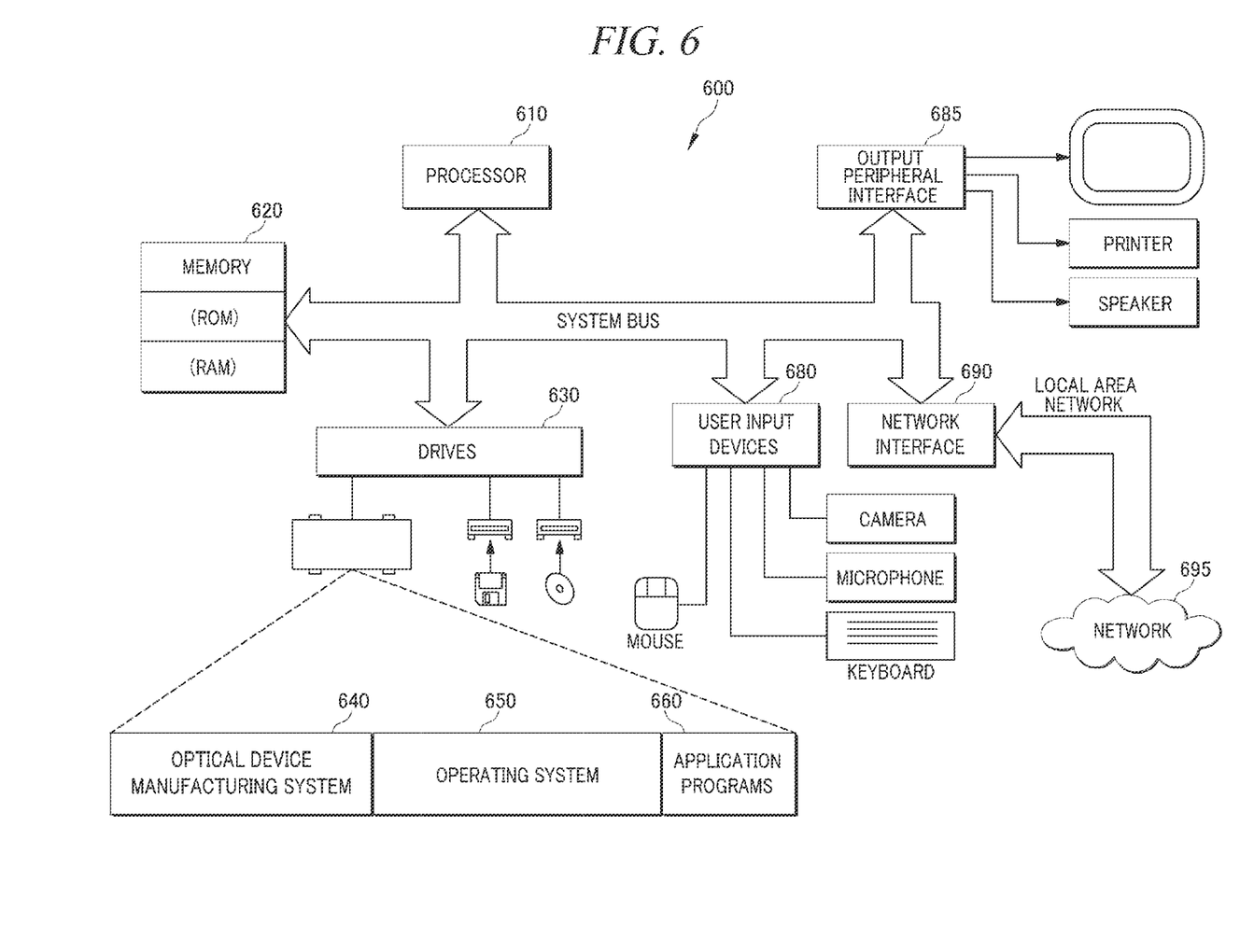
FIG. 6 shows a schematic block diagram illustrating an example computing system that can be configured to perform methods for manufacturing an optical device.

FIG. 6 shows a schematic block diagram illustrating an example computing system that can be configured to perform methods for manufacturing an optical device, arranged in accordance with at least some embodiments described herein. As depicted in Fig, 6, a computer 600 may include a processor 610, a memory 620 and one or more drives 630. Computer 600 may be implemented as a conventional computer system, an embedded control computer, a laptop, or a server computer, a mobile device, a set-top box, a kiosk, a vehicular information system, a mobile telephone, a customized machine, or other hardware platform.

Drives 630 and their associated computer storage media may provide storage of computer readable instructions, data structures, program modules and other data for computer 600. Drives 630 may include stored instructions associated with an optical device manufacturing system 640, an operating system 650, and/or one or more application programs 660. The instructions associated with the optical device manufacturing system 640 may be executed by the processor 610, where such instructions may facilitate any of the operations described herein (e.g., operations illustrated by FIGS. 4A-4E). The operation of computer 600 may also interact with additional equipment to facilitate the various operations. Example equipment interfaced with computer 600 may include UV light source 430, resin-injecting nozzle 410, machine manipulators and so on.

Computer 600 may further include user input devices 680 through which a user may enter commands and data. Input devices can include an electronic digitizer, a camera, a microphone, a keyboard and pointing device, commonly referred to as a mouse, trackball or touch pad. Other input devices may include a joystick, game pad, satellite dish, scanner, or the like.

These and other input devices can be coupled to processor 610 through a user input interface that is coupled to a system bus, but may be coupled by other interface and bus structures, such as a parallel port, game port or a universal serial bus (USB). Computers such as computer 600 may also include other peripheral output devices such as display devices, which may be coupled through an output peripheral interface 685 or the like.

Computer 600 may operate in a networked environment using logical connections to one or more computers, such as a remote computer coupled to a network interface 690. The remote computer may be a personal computer, a server, a router, a network PC, a peer device or other common network node, and can include many or all of the elements described above relative to computer 600.

Networking environments are commonplace in offices, enterprise-wide area networks (WAN), local area networks (LAN), intranets, and the Internet. When used in a LAN or WLAN networking environment, computer 600 may be coupled to the LAN through network interface 690 or an adapter. When used in a WAN networking environment, computer 600 typically includes a modem or other means for establishing communications over the WAN, such as the Internet or a network 695. The WAN may include the Internet, the illustrated network 695, various other networks, or any combination thereof. It will be appreciated that other mechanisms of establishing a communications link, ring, mesh, bus, cloud, or network between the computers may be used.

In some embodiments, computer 600 may be coupled to a networking environment. Computer 600 may include one or more instances of a physical computer-readable storage medium or media associated with drives 630 or other storage devices. The system bus may enable processor 610 to read code and/or data to/from the computer-readable storage media, The media may represent an apparatus in the form of storage elements that are implemented using any suitable technology, including but not limited to semiconductors, magnetic materials, optical media, electrical storage, electrochemical storage, or any other such storage technology. The media may represent components associated with memory 620, whether characterized as RAM, ROM, flash, or other types of volatile or nonvolatile memory technology. The media may also represent secondary storage, whether implemented as storage drives 630 or otherwise. Flash drive implementations may be characterized as solid state, or may include rotating media storing magnetically encoded information.

Processor 610 may be constructed from any number of transistors or other circuit elements, which may individually or collectively assume any number of states. More specifically, processor 610 may operate as a state machine or finite-state machine. Such a machine may be transformed to a second machine, or specific machine by loading executable instructions. These computer-executable instructions may transform processor 610 by specifying how processor 610 transitions between states, thereby transforming the transistors or other circuit elements constituting processor 610 from a first machine to a second machine. The states of either machine may also be transformed by receiving input from user input devices 680, network interface 690, other peripherals, other interfaces, or one or more users or other actors. Either machine may also transform states, or various physical characteristics of various output devices such as printers, speakers, video displays, or otherwise.

Figure 7:
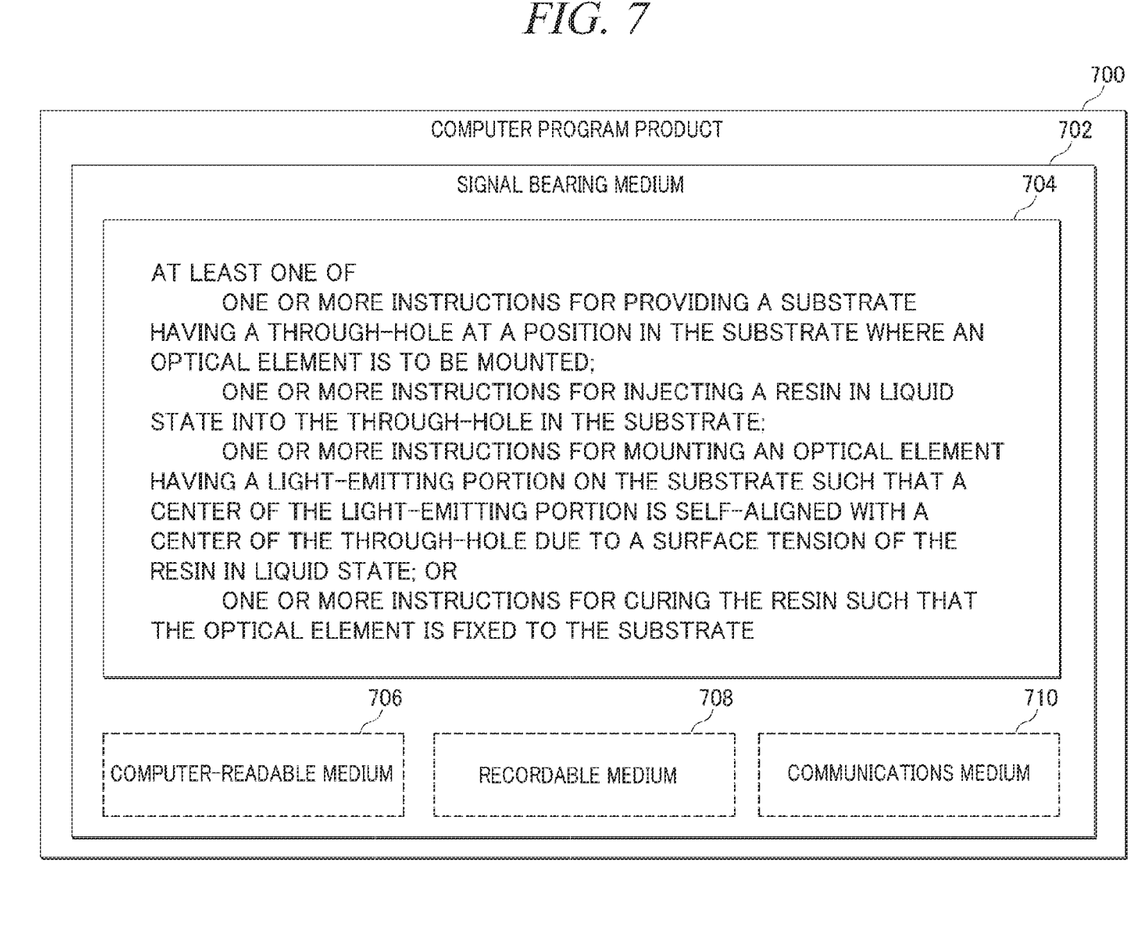
FIG. 7 illustrates computer program products that can be utilized to control an optical device manufacturing system to manufacture an optical device, all arranged in accordance with at least some embodiments described herein.

FIG. 7 illustrates computer program products that can be utilized to control an optical device manufacturing system to manufacture an optical device, arranged in accordance with at least some embodiments described herein. As depicted, a computer program product 700 may include a signal bearing medium 702. Signal bearing medium 702 may include one or more instructions 704 that, when executed by, for example, a processor, may provide the functionality described above with respect to FIGS. 1 to 5. By way of example, instructions 704 may include: one or more instructions for providing a substrate having a through-hole at a position in the substrate where an optical element is to be mounted; one or more instructions for injecting a resin in liquid state into the through-hole in the substrate; mounting an optical element having a light-emitting portion on the substrate such that a center of the light-emitting portion is self-aligned with a center of the through-hole due to a surface tension of the resin in liquid state; or one or more instructions for curing the resin such that the optical element is fixed to the substrate. Thus, for example, referring to FIGS. 4A to 4E, the optical device manufacturing system may undertake one or more of the blocks shown in FIG. 3 in response to instructions 704.

In some implementations, signal bearing medium 702 may encompass a computer-readable medium 706, such as, but not limited to, a hard disk drive, a Compact Disc (CD), a Digital Video Disk (DVD), a digital tape, memory, etc. In some implementations, signal bearing medium 702 may encompass a recordable medium 708, such as, but not limited to, memory, read/write (R/W) CDs, R/W DVDs, etc. In some implementations, signal bearing medium 702 may encompass a communications medium 710, such as, but not limited to, a digital and/or an analog communication medium (e.g., a fiber optic cable, a waveguide, a wired communications link, a wireless communication link, etc.). Thus, for example, program product 700 may be conveyed to one or more modules of an optical device manufacturing system or computing system 600 by an RE signal bearing medium 702, where signal bearing medium 702 is conveyed by a wireless communications medium 710 (e.g., a wireless communications medium conforming with the IEEE 802.11 standard).

The present disclosure is not to be limited in terms of the particular embodiments described in this application, which are intended as illustrations of various aspects. Many modifications and variations may be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, devices, storage mediums or systems, which can, of course, vary. It is also to be understood that the terminology used herein is for the purpose of describing particular embodiments only, and is not intended to be limiting.

The herein described subject matter sometimes illustrates different components contained within, or coupled with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method to manufacture an optical device, comprising:
    providing a substrate having a through-hole at a position in the substrate where an optical element is to he mounted and a first electrode positioned on an upper side of the substrate, wherein the first electrode comprises a first portion positioned adjacent to an edge of the through-hole and a second portion positioned adjacent to an opposite edge of the through-hole such that light to be transmitted from the optical element is enabled to pass through the through-hole;
    injecting a resin, which is in liquid state, into the through-hole in the substrate;
    providing the optical element, which includes a light-emitting portion and a second electrode, wherein the second electrode is positioned on a lower side of the optical element such that the second electrode and the first electrode are contiguous after the optical element is mounted on the substrate, and wherein the second electrode comprises a third portion positioned adjacent to an edge of the light-emitting portion and a fourth portion positioned adjacent to an opposite edge of the light-emitting portion such that the light to be transmitted from the optical element is enabled to be emitted from the light-emitting portion to the substrate;
    mounting the optical element on the substrate such that a center of the light-emitting portion is self-aligned with a center of the through-hole due to a surface tension of the resin in liquid state, wherein a wettability of the light-emitting portion with respect to a wettability of the electrode causes the light-emitting portion to receive a force such that the light-emitting portion is attracted toward a surface of the resin in liquid state at which the surface tension is effective; and
    curing the resin such that the optical element is fixed to the substrate.

2. The method of claim 1, wherein injecting the resin in liquid state comprises injecting an ultraviolet curing resin in liquid state into the through-hole in the substrate, and wherein curing the resin comprises curing the resin by irradiating an ultraviolet light onto the resin.

3. The method of claim 2, wherein irradiating the ultraviolet light onto the resin comprises irradiating the resin with an ultraviolet light with energy in a range of about 10 to 1,000 mJ or with an ultraviolet light with luminance in a range of about 100 to 1000 mW/cm$^2$ with an exposure time in a range of about 1 to 5 seconds.

4. The method of claim 1, wherein injecting the resin in liquid state comprises injecting a thermosetting resin in liquid state into the through-hole in the substrate, and wherein curing the resin comprises heating the resin.

5. The method of claim 1, further comprising:
    performing a solder reflow process to attach the first electrode of the substrate to the second electrode of the optical element.

6. The method of claim 1, wherein providing the substrate comprises adjusting a wettability of a side surface of the through-hole in the substrate.

7. A method to manufacture an optical device, comprising:
    providing a substrate having, a through-hole at a position in the substrate where an optical element is to be mounted and a first electrode positioned on an upper side of the substrate, wherein the first electrode comprises a first portion positioned adjacent to an edge of the through-hole and a second portion positioned adjacent to an opposite edge of the through-hole such that light to be transmitted from the optical element is enabled to pass through the through-hole;
    adjusting a wettability of a side surface of the through-hole in the substrate based on a resin to be injected;
    injecting the resin, which is in liquid state, into the through-hole in the substrate;
    providing the optical element, which includes, a light-emitting portion and a second electrode, wherein the second electrode is positioned on a lower side of the optical element such that the second electrode and the first electrode are contiguous after the optical element is mounted on the substrate, and wherein the second electrode comprises a third portion positioned adjacent to an edge of the light-emitting portion and a fourth portion positioned adjacent to an opposite edge of the light-emitting portion such that the light to be transmitted from the optical element is enabled to be emitted from the light-emitting portion to the substrate;
    mounting the optical element on the substrate such that a center of the light-emitting portion is self-aligned with a center of the through-hole due to a surface tension of the resin in liquid state; and
    curing the resin such that the optical element is fixed to the substrate.

8. The method of claim 7, wherein providing the substrate comprises forming the through-hole in the substrate using a high-aspect-ratio MEMS dry etching process.

9. The method of claim 7, wherein adjusting the wettability comprises performing a surface finishing process on the side surface of the through-hole in the substrate to adjust the wettability of the side surface.

10. The method of claim 7, wherein adjusting the wettability comprises coating a water-repellent material on the side surface of the through-hole in the substrate to adjust the wettability of the side surface.

11. The method of claim 7, further comprising adjusting a curvature of a surface of the resin in liquid state opposite to the optical element based on the wettability of the side surface of the through-hole in the substrate.

12. The method of claim 7, wherein a wettability of the light-emitting portion with respect to a wettability of the second electrode of the optical element causes the light-emitting portion to receive a force such that the light-emitting portion is attracted towards a surface of the resin in liquid state at which the surface tension is effective.

* * * * *